(12) United States Patent
Whitney et al.

(10) Patent No.: US 6,351,011 B1
(45) Date of Patent: *Feb. 26, 2002

(54) PROTECTION OF AN INTEGRATED CIRCUIT WITH VOLTAGE VARIABLE MATERIALS

(75) Inventors: Stephen J. Whitney, Lake Zurich; Edwin James Harris, IV, Des Plaines; Jeffrey S. Niew, Burr Ridge; Michael J. Weber, Wheeling, all of IL (US)

(73) Assignee: Littlefuse, Inc., Desplaines, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/481,927

(22) Filed: Jan. 12, 2000

Related U.S. Application Data

(63) Continuation-in-part of application No. 09/456,243, filed on Dec. 7, 1999.
(60) Provisional application No. 60/111,498, filed on Dec. 8, 1998.

(51) Int. Cl.⁷ .............................................. H01L 23/62
(52) U.S. Cl. ........................ 257/355; 257/787; 257/659
(58) Field of Search ................................. 257/355, 787, 257/659, 660

(56) References Cited

U.S. PATENT DOCUMENTS

| | | |
|---|---|---|
| 2,273,704 A | 2/1942 | Grisdale |
| 2,796,505 A | 6/1957 | Bocciarelli |
| 4,331,948 A | 5/1982 | Malinaric et al. |
| 4,726,991 A | 2/1988 | Hyatt et al. |
| 4,977,357 A | 12/1990 | Shrier |
| 4,992,333 A | 2/1991 | Hyatt |
| 5,142,263 A | 8/1992 | Childers et al. |
| 5,189,387 A | 2/1993 | Childers et al. |
| 5,260,848 A | 11/1993 | Childers |
| 5,294,374 A | 3/1994 | Martinez et al. |
| 5,476,714 A | 12/1995 | Hyatt |
| 5,669,381 A | 9/1997 | Hyatt |
| 5,781,395 A | 7/1998 | Hyatt |
| 5,869,869 A | 2/1999 | Hively |
| 5,955,762 A | 9/1999 | Hively |
| 5,970,321 A | 10/1999 | Hively |
| 6,211,554 B1 * | 4/2001 | Whitney |

FOREIGN PATENT DOCUMENTS

| | | |
|---|---|---|
| WO | WO 99/46819 | 9/1999 |
| WO | WO 99/46820 | 9/1999 |

* cited by examiner

*Primary Examiner*—Sheila V. Clark
(74) *Attorney, Agent, or Firm*—Bell, Boyd & Lloyd LLC

(57) ABSTRACT

A number of integrated circuit dies having on board protection against electrical overstress (EOS) transients are provided. Generally, the devices have an integrated circuit die with an outer periphery and a functional die area. A plurality of conductive input/output pads are formed on the integrated circuit die. Typically, a first conductive guard rail is disposed on the integrated circuit die and forms a gap between each one of the input/output pads. A voltage variable material is disposed in the gaps between the conductive guard rail and the input/output pads. Typically, a plurality of electrical leads are electrically connected to a respective one of the plurality of conductive input/output pads. At normal operating voltages, the voltage variable material is non-conductive. However, in response to an EOS transient, the voltage variable material switches to a low resistance state, providing a conductive path between the conductive guard rail and the input/output pads.

26 Claims, 7 Drawing Sheets

LEAD FRAME USED FOR ASSEMBLY

PROTECTION OF AN INTEGRATED CIRCUIT WITH VOLTAGE VARIABLE MATERIALS

This application is a Continuation-In-Part of U.S. application Ser. No. 09/456,243, filed Dec. 7, 1999, that claims the benefit of U.S. Provisional Application No. 60/111,498, filed Dec. 8, 1998.

BACKGROUND OF THE INVENTION

The present invention generally relates to the use of voltage variable materials for the protection of an integrated circuit against electrical overstress (EOS) transients.

There is an increased demand for materials and electrical components which can protect electronic circuits from EOS transients which produce high electric fields and usually high peak energies capable of destroying circuits or the highly sensitive electrical components in the circuits, rendering the circuits and the components non-functional, either temporarily or permanently. The EOS transient can include transient voltage or current conditions capable of interrupting circuit operation or destroying the circuit outright. Particularly, EOS transients may arise, for example, from an electromagnetic pulse, an electrostatic discharge, lightning, or be induced by the operation of other electronic or electrical components. Such transients may rise to their maximum amplitudes in microsecond to subnanosecond time frames and may be repetitive in nature. A typical waveform of an electrical overstress transient is illustrated in FIG. 1. The peak amplitude of the electrostatic discharge (ESD) transient wave may exceed 25,000 volts with currents of more than 100 amperes.

Materials for the protection against EOS transients (EOS materials) are designed to respond essentially instantaneously (i.e., ideally before the transient wave reaches its peak) to reduce the transmitted voltage to a much lower value and clamp the voltage at the lower value for the duration of the EOS transient. EOS materials are characterized by high electrical resistance values at low or normal operating voltages and currents. In response to an EOS transient, the material switches essentially instantaneously to a low electrical resistance value. When the EOS threat has been mitigated these materials return to their high resistance value. These materials are capable of repeated switching between the high and low resistance states, allowing circuit protection against multiple EOS events. EOS materials are also capable of recovering essentially instantaneously to their original high resistance value upon termination of the EOS transient. For purposes of this application, the high resistance state will be referred to as the "off-state" and the low resistance state will be referred to as the "on-state."

FIG. 2 illustrates a typical electrical resistance versus d.c. voltage relationship for EOS materials. Circuit components including EOS materials can shunt a portion of the excessive voltage or current due to the EOS transient to ground, thus, protecting the electrical circuit and its components. The major portion of the threat transient is either dissipated at the source resistance or reflected back towards the source of the threat. The reflected wave is either attenuated by the source, radiated away, or re-directed back to the surge protection device which responds with each return pulse until the threat energy is reduced to safe levels.

A typical integrated circuit die having a plurality of input/output (I/O) conductive pads is illustrated in FIG. 3. Wires are bonded to the I/O pads and are connected to a corresponding electrical lead of a lead frame. Prior integrated circuit dies have voltage suppression components such as diodes, thyristors or transistors formed on the die near the I/O pads during the processing of the die to protect oxide layers, semiconductor junctions, and metal traces in the functional die area from the harmful effects of EOS transients. The assembly is typically encapsulated in a protective housing and the electrical leads of the lead frame which extend outwardly from the housing are formed in order to be connected to a circuit substrate (e.g., a printed circuit board). The components used to protect the functional area of the die are often relatively large, consuming costly die area which can otherwise be used for additional functions. In addition, the overall encapsulated device is relatively large, consuming costly real estate on the circuit substrate.

SUMMARY OF THE INVENTION

The present invention relates to an integrated circuit die and devices including same that include a voltage variable material to provide protection from EOS transients. Pursuant to the present invention, any voltage variable material can be used. A number of advantages are provided by the present invention, where integrated circuit devices are susceptible to high voltages associated with EOS transients.

In an embodiment, the present invention provides an integrated circuit including an electrically insulating substrate having at least one microelectronic device formed thereon. An input/output pad and a conductive member are formed on the substrate. A bond wire is electrically connected between the input/output pad and an electrical lead. A voltage variable material is located between the bond wire and the conductive member, the voltage variable material exhibits non-conductive behavior at normal circuit operating voltages and electrically connects the bond wire to the conductive member when a sufficient EOS transient is introduced into the circuit.

In an embodiment, the conductive member is a guard rail.

In an embodiment, the voltage variable material fills an entire space between the bond wire and the conductive member.

In an embodiment, the integrated circuit includes at least two input/output pads.

In yet another embodiment of the present invention, an electrical device includes an integrated circuit die, an electrical connector connected to the die, and a conductive guard rail. The electrical device also includes a voltage variable material exhibiting non-conductive behavior at normal circuit operating voltages and forming a conductive path between the electrical connector and the conductive guard rail when a sufficient EOS transient is introduced into the circuit.

In an embodiment, the electrical connector is an input/out pad.

In an embodiment, the electrical connector is a wire.

In an embodiment, the voltage variable material is selectively deposited on the guard rail, and the electrical connector is a wire juxtaposed to the guard rail.

In an embodiment, the electrical connector is a wire and the wire is coated with the voltage variable material.

In a further embodiment of the present invention, an electrical device is provided that includes a ground pad, an integrated circuit die on the ground pad, an electrical lead, and a conductive island. The conductive island has first and second electrical connectors, the first electrical connector is connected to the integrated circuit die and the second electrical connector is connected to the electrical lead. A voltage variable material is disposed between the ground pad and the island.

In an embodiment, the voltage variable material completely fills the space between the ground pad and the island.

In an embodiment, the electrical device includes a plurality of circuits.

In an embodiment, the voltage variable material is disposed between the island and the electrical lead.

In another embodiment of the present invention, an integrated circuit is provided that includes a printed circuit board having an input/output pad and a substrate having an upper surface facing toward the printed circuit board. An input/output pad is located on the upper surface of the substrate and is electrically connected to the input/output pad of the printed circuit board. A ground pad is also located on the upper surface of the substrate. A voltage variable material is located between the ground pad and the input/output pad of the upper surface.

In an embodiment, the ground pad is located in juxtaposition to the input/output pad.

In an embodiment, the voltage variable material fills the entire space between the ground pad and the input/output pad.

In an embodiment, the printed circuit board further includes a ground pad adjacent the input/output pad of the printed circuit board, and the voltage variable material electrically connects the input/output pad of the printed circuit board to the ground pad of the printed circuit board in response to an EOS transient energy.

In an embodiment, the voltage variable material fills an entire space between the input/output pad and the ground pad of the printed circuit board.

In yet a further embodiment of the present invention, an integrated circuit is provided that includes an integrated circuit die, an insulating layer on the integrated circuit die, and a first electrical connector. A second electrical connector is connected to the first electrical connector and connected to the integrated circuit die. A conductive member is located between a portion of the insulating layer and the integrated circuit die. A voltage variable material is interposed between the portion of the insulating layer and the integrated circuit die, the voltage variable material electrically connecting the second electrical connector to the conductive member when an EOS transient is introduced into the circuit.

In an embodiment, the conductive member is on the die.

In an embodiment, the conductive member is on the insulating layer.

In an embodiment, the insulating layer further includes a first side and the conductive member is located on the first side.

In an embodiment, the conductive member is a ground rail.

In an embodiment, the conductive member is a power rail.

Additional features and advantages of the present invention are described in, and will be apparent from, the detailed description of the presently preferred embodiments set forth below and the figures.

BRIEF DESCRIPTION OF THE DRAWINGS

Reference is made to the attached drawings, wherein elements having the same reference numeral represent like elements throughout and wherein.

DETAILED DESCRIPTION OF THE PRESENTLY PREFERRED EMBODIMENTS

Figure 1:
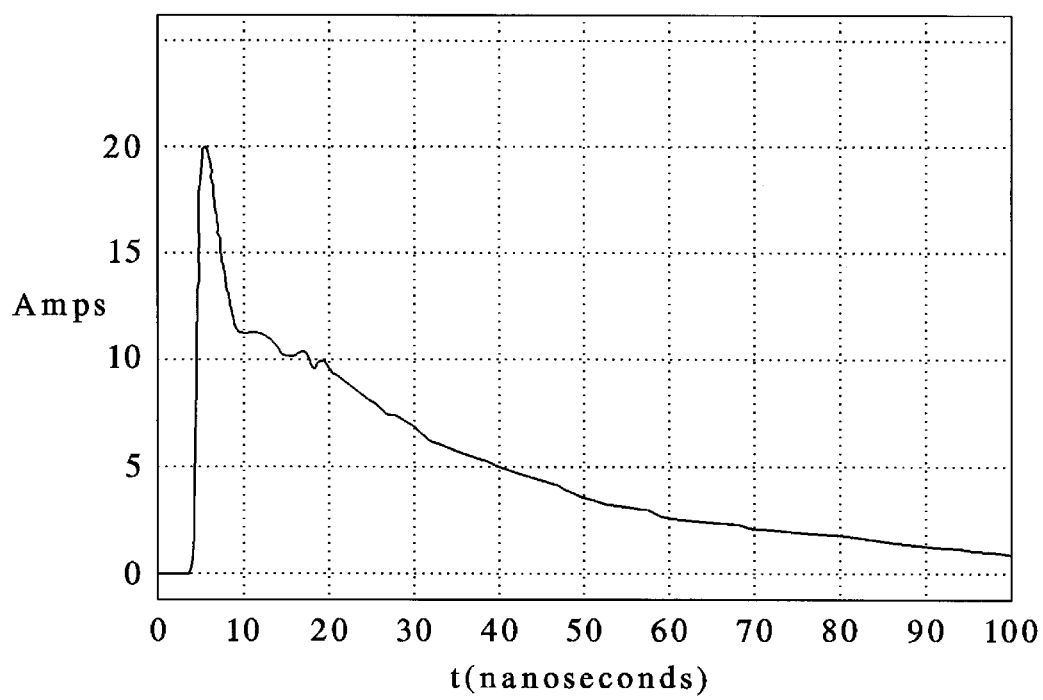
FIG. 1 graphically illustrates a typical current waveform of an EOS transient.
Figure 2:
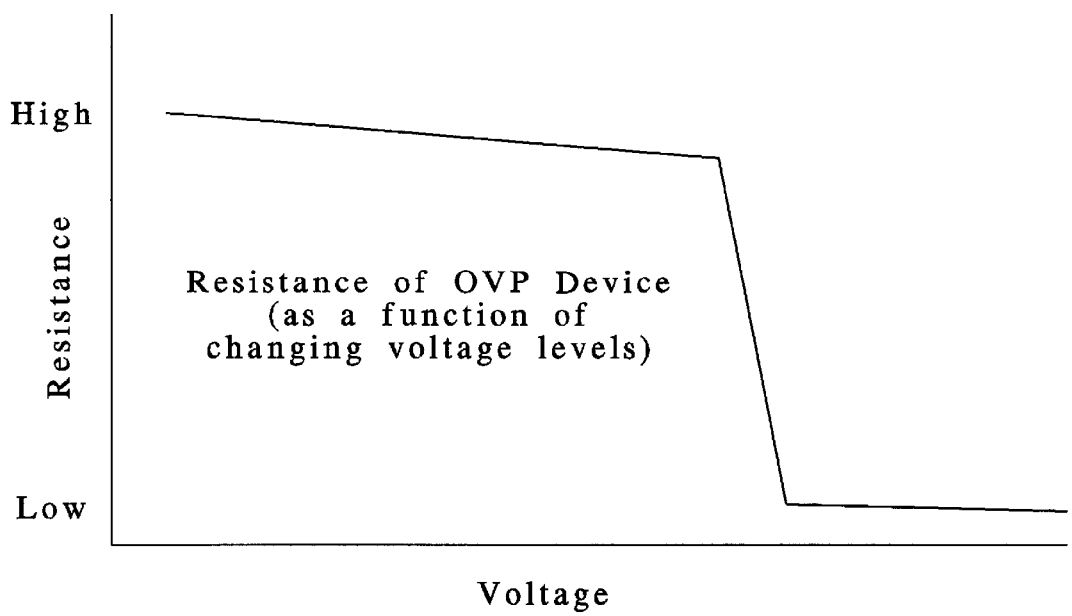
FIG. 2 graphically illustrates the electrical resistance versus d.c. voltage relationship of typical EOS materials.

The present invention relates to integrated circuits and devices including same. The products of the present invention include a voltage variable material for protection against EOS transients. Pursuant to the invention, any voltage variable material can be used.

By way of example, and not limitation, examples of EOS materials and methods for making EOS materials that can be used in the present invention, the disclosures of which are incorporated herein by reference, are as follows.

U.S. patent application Ser. No. 09/136,507 discloses compositions for providing protection against EOS. The compositions include a matrix formed of a mixture of an insulating binder, conductive particles having an average particle size of less than 10 microns, and semiconductive particles having an average particle size of less than 10 microns. The compositions utilizing relatively small particle sized conductive and semiconductive fillers exhibit clamping voltages in a range of about 30 volts to about 2,000 volts or greater.

U.S. Pat. No. 2,273,704, issued to Grisdale, discloses granular composites which exhibit non-linear current voltage relationships. These mixtures are comprised of granules of conductive and semiconductive granules that are coated with a thin insulative layer and are compressed and bonded together to provide a coherent body.

U.S. Pat. No. 2,796,505, issued to Bocciarelli, discloses a non-linear voltage regulating element. The element is comprised of conductor particles having insulative oxide surface coatings that are bound in a matrix. The particles are irregular in shape and make point contact with one another.

U.S. Pat. No. 4,726,991, issued to Hyatt et al., discloses an EOS protection material comprised of a mixture of conductive and semiconductive particles, all of whose surfaces are coated with an insulative oxide film. These particles are bound together in an insulative binder. The coated particles are preferably in point contact with each other and conduct preferentially in a quantum mechanical tunneling mode.

U.S. Pat. No. 5,476,714, issued to Hyatt, discloses EOS composite materials comprised of mixtures of conductor and semiconductor particles in the 10 to 100 micron range with a minimum proportion of 100 angstrom range insulative particles, bonded together in a insulative binder. This invention includes a grading of particle sizes such that the composition causes the particles to take a preferential relationship to each other.

U.S. Pat. No. 5,260,848, issued to Childers, discloses foldback switching materials which provide protection from transient overvoltages. These materials are comprised of mixtures of conductive particles in the 10 to 200 micron range. Semiconductor and insulative particles are also employed in these compositions. The spacing between conductive particles is at least 1000 angstroms.

By way of further example, and not limitation, additional EOS polymer composite materials that can be used in the present invention are also disclosed in U.S. Pat. Nos. 4,331,948, 4,726,991, 4,977,357, 4,992,333, 5,142,263, 5,189,387, 5,294,374, 5,476,714, 5,669,381, and 5,781,395, the teachings of which are specifically incorporated herein by reference.

Figure 3:
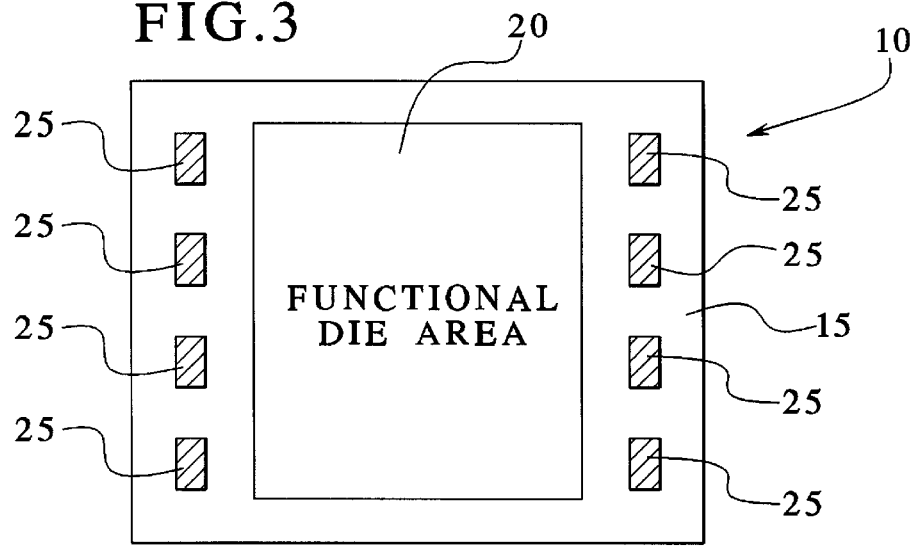
FIG. 3 illustrates a typical integrated circuit die.

Referring now to the drawings, FIG. 3 illustrates a conventional integrated circuit die 10. The die 10 is typically comprised of a silicon wafer 15 having a functional die area 20 and a plurality of conductive input/output ("I/O") pads 25. The functional area 20 of the die 10 has a circuit integrated therein. It should be generally understood by those having skill in the art that the integrated circuit can be created by various processes; e.g., by doping the silicon, or depositing resistive and conductive films on the wafer and imposing patterns to form an electrical network. The present invention is concerned with protecting the integrated circuit from extremely high energies associated with EOS transients.

Figure 4:
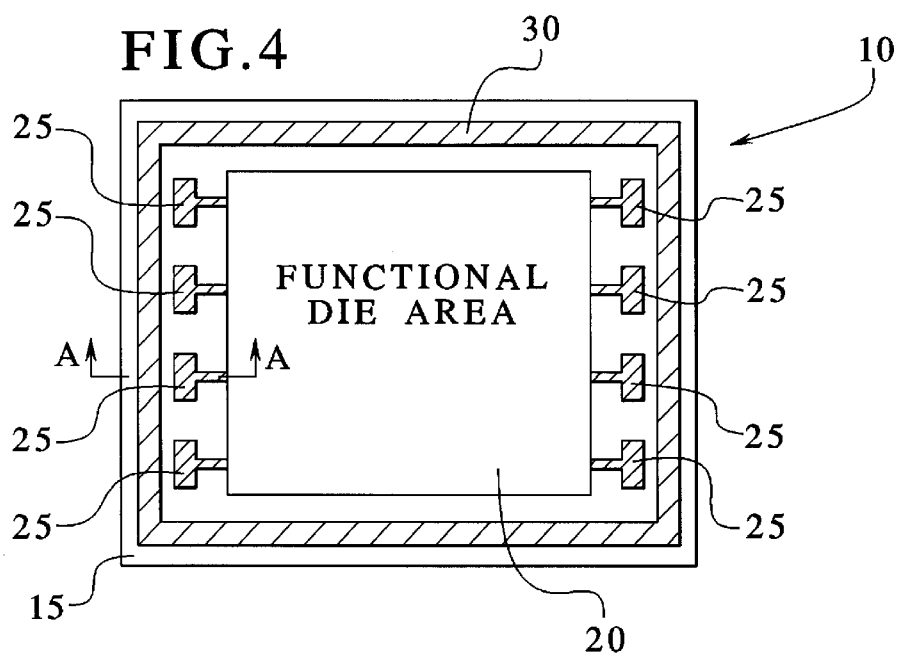
FIG. 4 illustrates a top view of an integrated circuit die according to one embodiment of the present invention.

With reference to FIG. 4, the integrated circuit die 10 of the present invention includes a plurality of conductive I/O pads 25 disposed on the surface of the die 10. The conductive I/O pads 25 are electrically connected to the integrated circuit, i.e., the functional die area 20. A first conductive guard rail 30 is disposed on the die 10. Preferably, the guard rail 30 is disposed on the die 10 adjacent to the I/O pads 25 and is comprised of a metallized trace. A gap 25a is formed between the guard rail 30 and each one of the I/O pads 25 on the surface of the die 10.

In the embodiment illustrated, a voltage variable material 35 is disposed on the surface of the die 10, filling the gaps 25a between the conductive guard rail 30 and each one of the plurality of I/O pads 25. As noted above, any voltage variable material, or EOS material, can be used pursuant to the present invention. Moreover, it should be noted that the material does not have to entirely fill the gaps 25a. The voltage variable material 35 is in electrical contact, and preferably in direct contact with, the conductive rail 30 and the I/O pads 25. At normal operating voltages (i.e., relatively low voltages), the voltage variable material 35 exhibits a relatively high electrical resistance. Thus, energies associated with the normal operation of the integrated circuit are not applied between the first conductive rail 30 and the I/O pads 25. However, upon application of an Eog transient energy (i.e., relatively high voltages), the voltage variable material 35 switches to a relatively low electrical resistance and electrically connects the I/O pads 25 to the conductive guard rail 30. As a result, the voltage variable material 35 creates a conductive path away from the functional area of the die 20 for the EOS transient energy to follow. The conductive guard rail 30 can be connected to a ground rail or a +/− power supply rail.

Figure 8:
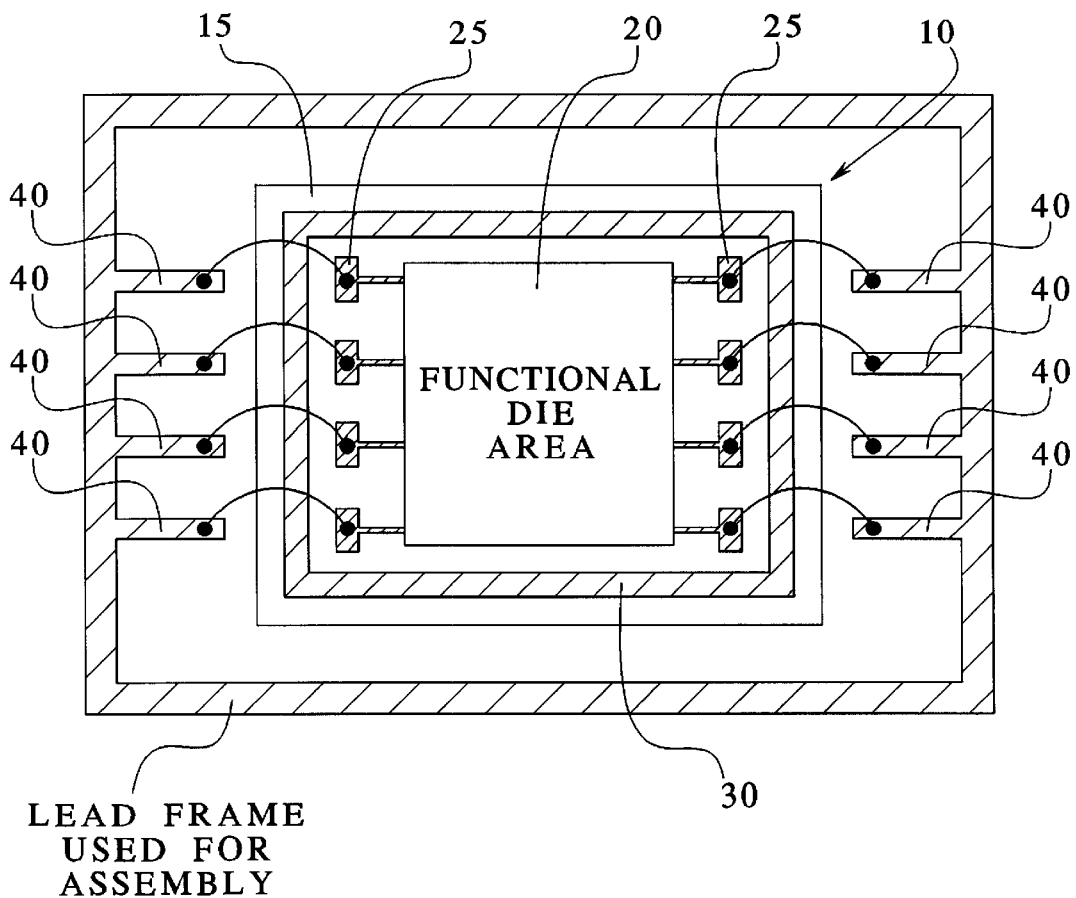
FIG. 8 illustrates an integrated circuit die according to the present invention electrically connected to a lead frame assembly.

As shown in FIG. 8, a plurality of electrical leads 40 are electrically connected to a respective one of the plurality of conductive I/O pads 25. Typically, the electrical leads 40 are wire bonded to the I/O pads 25.

Figure 5:
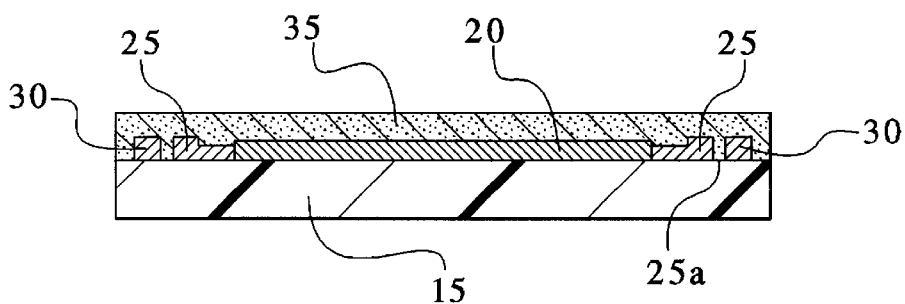
FIG. 5 illustrates a cross-sectional view along line A—A of the integrated circuit die shown in FIG. 4 having a layer of voltage variable material deposited over the top surface of the die.

In a preferred embodiment, the voltage variable material 35 is applied to the entire surface of the die 10 completely covering the guard ring 30, the plurality of 1/O pads 25 and the functional die area 20 (as shown in the cross-sectional view of FIG. 5). However, the voltage variable material 35 can be applied in any manner or configuration as long as the material 35 connects the I/O pads 25 to the conductive guard rail 30. For example, the material 35 can be applied as two separate strips, each strip connecting the I/O pads 25 located on opposite sides of the die 10 to the guard rail 30, or each I/O pad 25 could be connected to the guard rail 30 with a separate body of voltage variable material 35. In another example, the voltage variable material may be selectively deposited between the I/O pads 25 and the guard rail 30.

Figure 10:
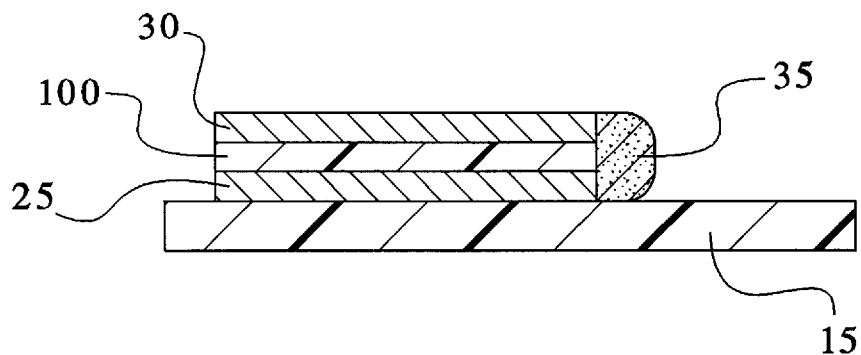
FIGS. 10–12 illustrate alternative embodiments wherein a voltage variable material connects a conductive guard rail in a first plane to an I/O pad in a second plane.
Figure 11:
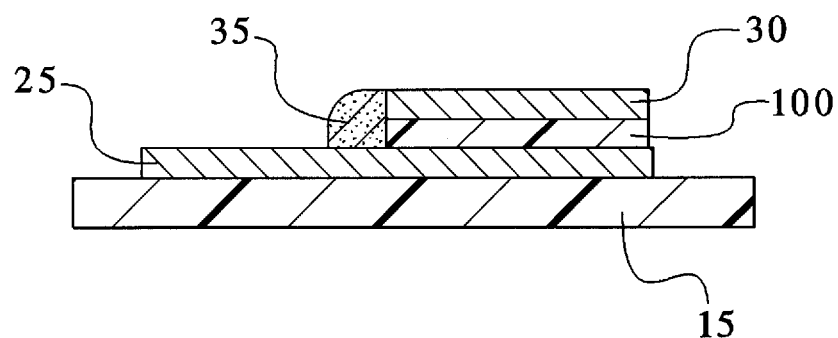
Figure 12:
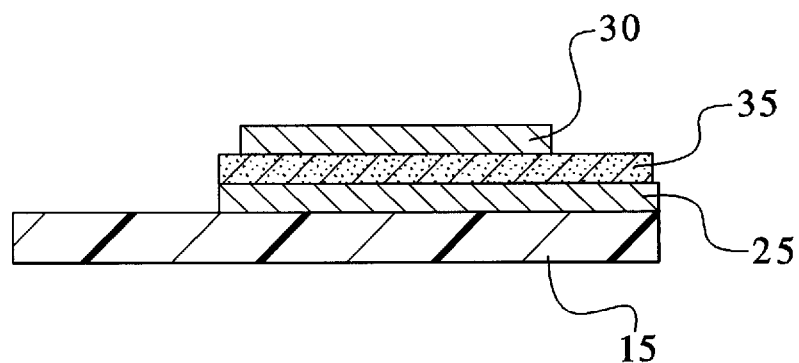

The present invention also contemplates arrangements wherein the I/O pads 25 and the conductive guard rail 30 are connected to the die 10 in different planes. For example, the voltage variable material 35 can be interposed between the I/O pads 25 and the conductive guard rail 30 (see FIG. 12), or the voltage variable material 35 can butt up against the ends of the I/O pads 25 and the conductive guard rail 30 with an insulating layer 100 separating the I/O pads 25 and the conductive guard rail 30 (see FIG. 10), or the voltage variable material 35 can be disposed on one of either the I/O pads 25 or the conductive guard rail 30 and butt up against the end of the other one of the I/O pads 25 or the conductive guard rail 30 with an insulating layer 100 separating the I/O pads 25 and the conductive guard rail 30 (see FIG. 11).

When an EOS transient is discharged to one of the electrical leads 40, a voltage is applied to the corresponding I/O pad 25. This applied voltage from the EOS transient is much higher than the voltage supplied by the power supply rail. The much higher voltage causes the voltage variable material 35 to rapidly switch (e.g., a matter of nanoseconds) from a high resistance state to a low resistance state, collapsing the voltage across the gap 25a between the I/O pad 25 and the guard rail 30. As a result, the sensitive integrated circuit structures in the functional die area 20 are protected from the harmful affects of the EOS transient energy.

To achieve protection across a wider range of voltages, the voltage variable material 35 could be used in combination with one or more discrete voltage suppression devices also electrically connected to the I/O pads 25. As mentioned above, such devices may include a diode, thyristor or transistor.

Figure 13:
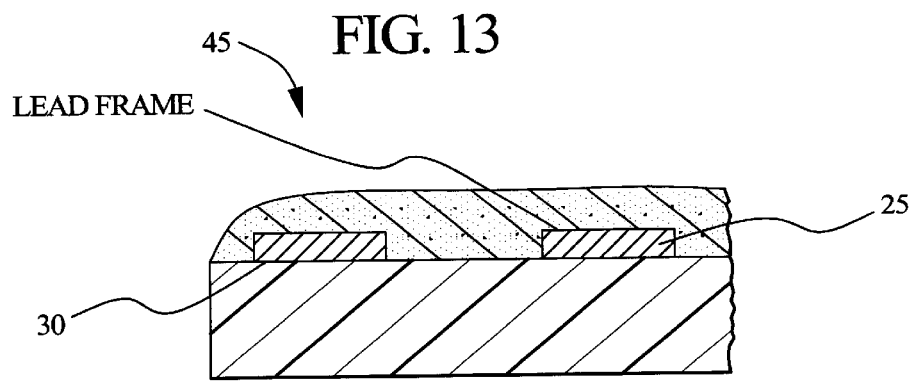
FIG. 13 illustrates a cross-sectional view of the integrated circuit die of FIG. 8 according to another embodiment of the present invention.

Additionally, the embodiment shown in FIG. 8 can utilize a bond wire 45 to establish a conductive path to the guard rail 30 in the event of an EOS transient discharge. As shown in FIGS. 8 and 13, the bond wire 45 extends from each of the I/O pads 25 to the lead frame to electrically connect the I/O pads 25 to the lead frame. In an embodiment, the voltage variable material 35 is generally disposed on the die 20. The guard rail 30, the I/O pads 25 and a portion of the bond wire 45 are in contact with the voltage variable material 35. A conductive path is established between the bond wire 45 and the conductive guard rail 30 that is connected to ground. Generally, this conductive path is desirable due to spacing and field line interaction between the wire bond 45 and the conductive guard rail 30.

Of course, this concept is susceptible to other embodiments. Additional embodiments include coating the bond wire 45 with the voltage variable material 35 and laying the coated bond wire 45 on, or near, the conductive guard rail 30. Also, the voltage variable material 35 can be selectively deposited on the conductive guard rail 30 with the bond wire 45 in juxtaposition to the voltage variable material 35. Thus, when an EOS transient voltage occurs a conductive path is created between the bond wire 45 and the guard rail 30.

Figure 6:
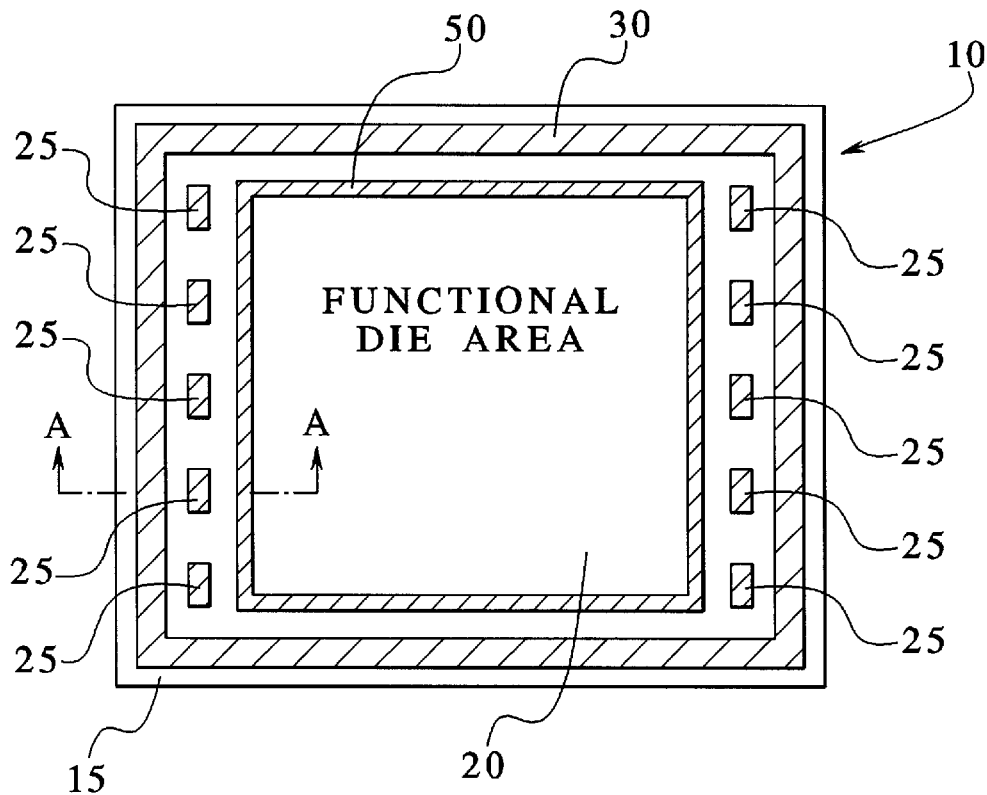
FIG. 6 illustrates a top view of an integrated circuit die according to another embodiment of the present invention.
Figure 7:
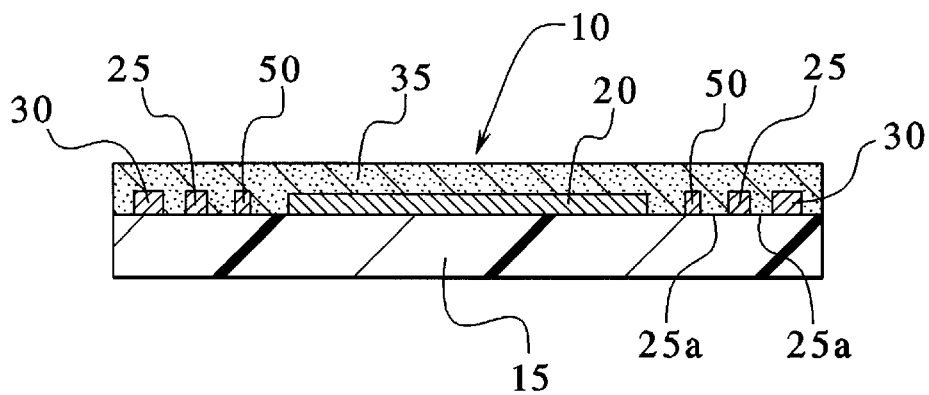
FIG. 7 illustrates a cross-sectional view along line A—A of the integrated circuit die shown in FIG. 6 having a layer of voltage variable material deposited over the top surface of the die.

A preferred embodiment is shown in FIGS. 6 and 7, wherein a second conductive guard rail 50 is disposed on the surface of the integrated circuit die 10. In this embodiment, the guard rails 30,50 are formed adjacent to and on opposite sides of the I/O pads 25. In this sandwich configuration, the first conductive guard rail 30 is electrically connected to a positive power supply rail and the second conductive guard rail 50 is electrically connected to the negative power supply rail. (Alternatively, the first conductive guard rail 30 can be connected to the negative power supply rail and the second conductive guard rail 50 connected to ground.)

A gap 25a is formed between each of the first and second guard rails 30,50 and the I/O pads 25. The voltage variable material 35 provides a path between the I/O pads 25 and the first and second conductive guard rails or rings 30,50. At normal operating voltages, this path is not conductive. However, at the higher voltages associated with EOS transients, the path becomes conductive, thus, leading the EOS transient energy away from the functional die area 20.

Preferably, the voltage variable material 35 is applied to the surface of the integrated circuit die 10 and covers at least the I/O pads 25 and the conductive guard rails 30,50. In a more preferred embodiment, the voltage variable material 35 is applied to the entire surface of the integrated circuit die 10. It should be understood by those having skill in the art that many different configurations of guard rails 30,50 can be used depending on the size and shape of the die 10 and the size and complexity of the electrical components forming the integrated circuit.

Similar to the application described above, a bond wire 45 can be utilized with the voltage variable material 35 to create a conductive path to either one of the conductive guard rails 30, 50 when higher voltages associated with EOS transients are present.

Figure 14:
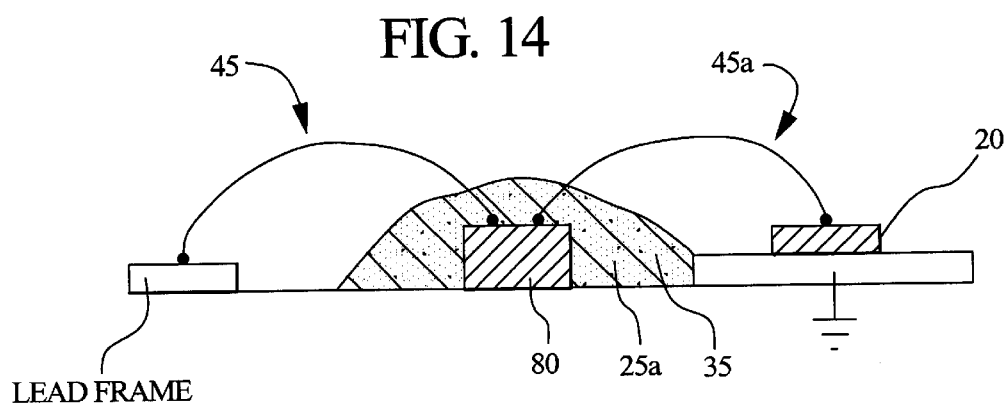
FIG. 14 illustrates a cross-sectional view of an integrated circuit die according to another embodiment of the present invention.

In FIG. 14, another embodiment of the invention is illustrated. In this embodiment the device includes a conductive island 80, an integrated circuit die 20 and a lead frame. Generally, the island 80 is made of a metallization. The island 80 is electrically connected to the lead frame via a bond wire 45. The island 80 is also connected to the die 20 via a bond wire 45a. A gap 25a is formed between the island 80 and ground.

The voltage variable material 35 is disposed on the gap 25a between the island 80 and ground. This can be accomplished by generally filling the gap between the island 80 and ground. As discussed earlier, the gap 25a can be either completely filled or selectively deposited with the voltage variable material 35. In addition, the voltage variable material 35 can cover the island 80 as well as the gap 25a. In the event of EOS transient energy causing higher voltages, a conductive path is created between the island 80 and ground.

An advantage of this embodiment is that the location of the lead frame is not critical due to the inclusion of the island 80. In fact, the lead frame can be located anywhere on the substrate. As such, this embodiment provides for additional design flexibility of the integrated circuit device.

As discussed above, a wide range of voltage variable materials 35 can be used in the present invention. Although the scope of the present invention is not limited to any particular material, a voltage variable material 35 exhibiting a high impedance at normal circuit operating voltages is preferred.

Figure 9:
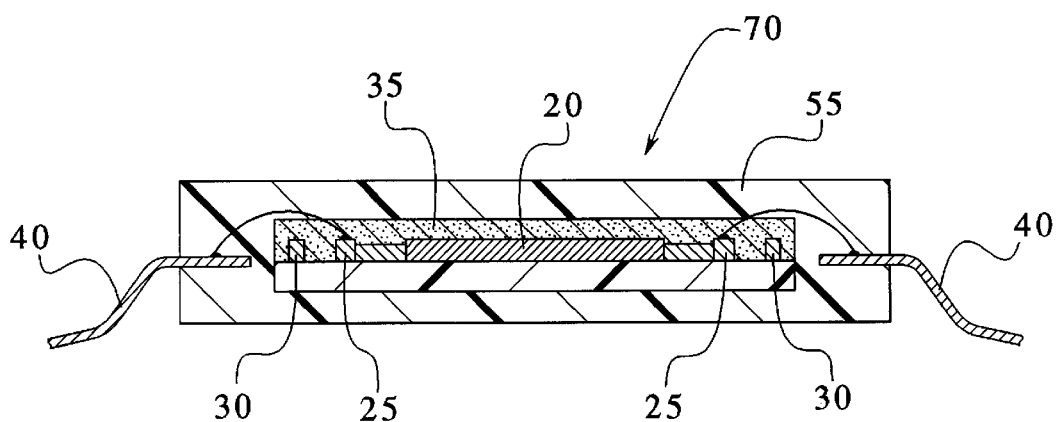
FIG. 9 illustrates the integrated circuit die of FIG. 8 encapsulated in a protective housing.

In another preferred embodiment, illustrated in FIG. 9, a protective housing 55 covers the integrated circuit die 10. The protective housing 55, preferably formed from an electrically insulating material, encapsulates the integrated circuit die 10 and physically connects the plurality of electrical leads 40 to the integrated circuit die 10. The electrical leads 40 project outwardly from the protective housing 55 and are adapted for electrically connecting the device 70 to a source of power.

Figure 15:
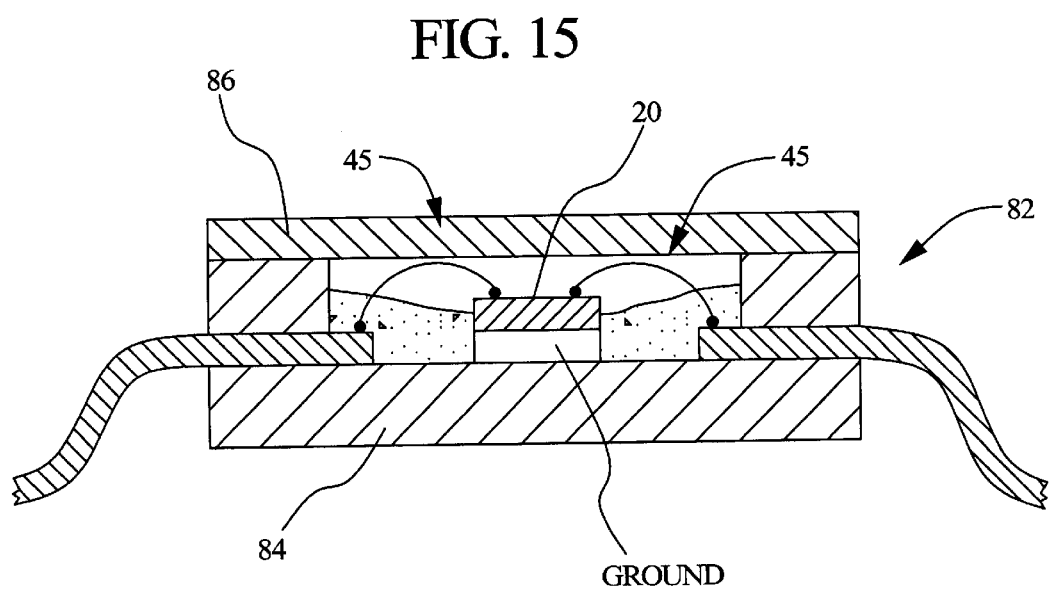
FIG. 15 illustrates a cross-sectional view of an integrated circuit die according to another embodiment of the present invention encapsulated in a protective housing.

Additionally, FIG. 15 shows another protective housing 82 that can be used for hermetic packaging applications. Generally, the device is encapsulated by a ceramic dish 84 that is built around the lead frame. A lid 86 covers the ceramic dish 84. The material of the lid 86 can be, for example, a metal or glass. The lid 86 and dish 84 are hermetically sealed through various methods, such as firing or braising the lid 86 and dish 84 together.

Figure 16:
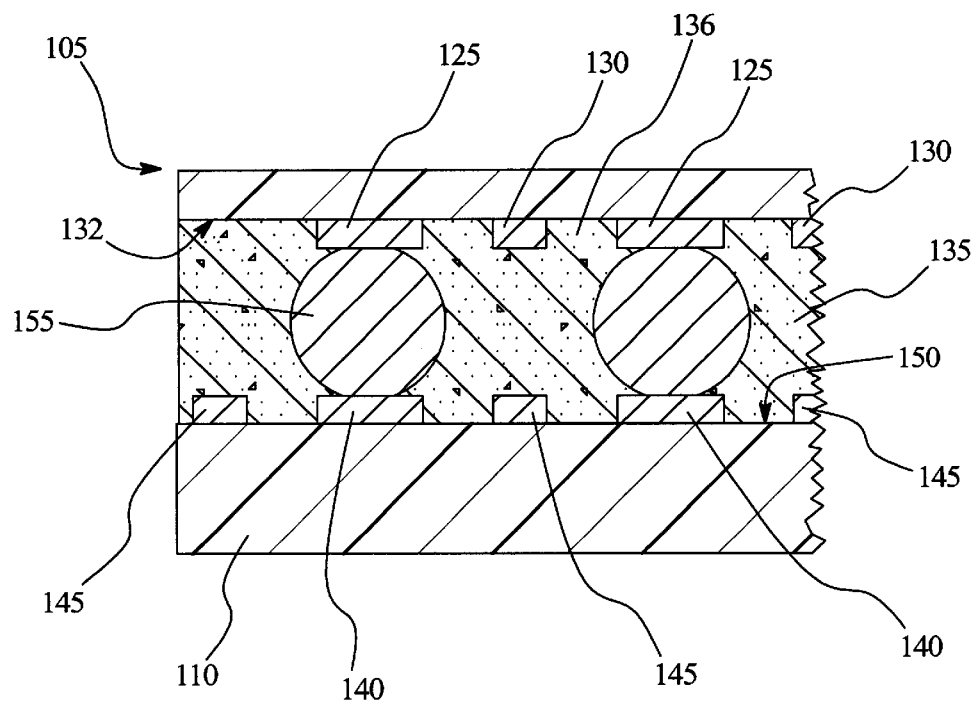
FIG. 16 illustrates a cross-sectional view of a flip-chip integrated circuit mounted on a printed circuit board according to the present invention.

Another embodiment of the invention utilizes the chip scale packaging known as a "flip-chip." FIG. 16 illustrates a flip-chip 105 mounted on a printed circuit board 110. The flip-chip 105 has a number of I/O pads 125. Next to each of the I/O pads 125 is a ground pad 130. The ground pads 130 are also located at a surface 132 of the flip-chip 105. The printed circuit board 110 also includes a number of I/O pads 140 and a number of ground pads 145 next to each of the I/O pads 140 on a surface 150 of the printed circuit board 110. In this example, the I/O pads 125 are electrically connected to the I/O pads 130 via solder balls or bumps 155. Of course, other similar types of electrical connectors can be used.

In FIG. 16, the voltage variable material 135 is used as an underfill that is interposed between the flip-chip 105 and the printed circuit board 110. Thus, in addition to the conductive characteristics of the voltage variable material as discussed above, the voltage variable material is also capable of providing mechanical under strength to the device as well as protecting the electronic connections during the circuit board washing processes. When an EOS transient voltage occurs a conductive path is created between the I/O pads 125 or 140 and the respective ground pads 130, 145. In this embodiment, the conductive path occurs at the surface 132 of the flip-chip 105 or the surface 150 of the printed circuit board 110. By maintaining a conductive path at the surface, stresses in the chip and/or printed circuit board caused by the EOS transients, such as heat and radiation, are significantly reduced.

Additionally, the voltage variable material 135 can be applied to the surface 132 of the flip-chip 105 only. In this application, the voltage variable material 135 creates a conductive path between the I/O pad 125 of the flip-chip 105 and the respective ground pad 130 during EOS transient voltages.

Alternatively, the voltage variable material 135 can be applied to the surface 150 of the printed circuit board 110. As such, the conductive path created by the voltage variable material 135 is created at the surface 150 of the printed circuit board 110.

Additionally, the voltage variable-material 135 can be disposed within a gap 136 that is created between the I/O pad 125 and the ground pad 130 or the I/O pad 140 and the ground pad 145.

Figure 17:
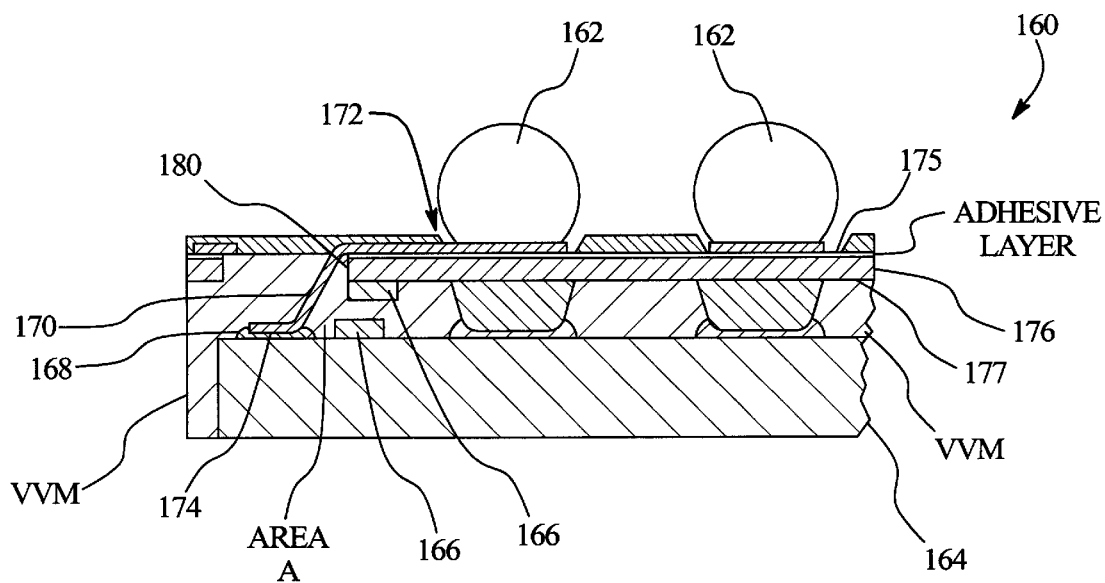
FIG. 17 illustrates a cross-sectional view of a chip scale packaging according to the present invention.

FIG. 17 illustrates a chip scale packaging 160 having a ball grid array 162. In this application, an integrated circuit die 164 includes a ground pin or rail 166, and a bond ribbon pad 168. A bond ribbon 170 includes a first end 172 and a second end 174. The second end 174 is connected to the bond ribbon pad 168. The first end 172 of the bond ribbon 170 is connected to the solder ball 162. For example, the bond ribbon 170 is positioned between the solder ball 162 and a first side 175 of an insulating layer 176, e.g., a polyimide tape layer. A second side 177 of the insulating layer 176 faces toward the integrated circuit die 164.

Similar to the flip-chip application described above, the voltage variable material 135 can be applied to the present chip scale packaging 160 as an underfill 135. In this application, the voltage variable material 135 is interposed between the second side 177 of the insulating layer 176 and the integrated circuit die 164. When the EOS transient voltage occurs, a conductive path is created between the bond ribbon 170 and the ground pin or rail 166.

Additionally, the voltage variable material 135 does not have to completely underfill the space between the die 164 and the insulating layer. For example, the voltage variable material can be applied in Area A near the bond ribbon 170 and the ground rail 166. Further, the voltage variable material 135 can be applied to the bond ribbon 170 or the ground rail 166 by many of the earlier methods described herein, e.g., coating the bond ribbon or selectively depositing the voltage variable material on the guard rail.

In another embodiment of the invention, the ground rail 166 is located on the insulating layer 176. For example, the ground rail 166 can be on the first side 175 or on an end 180 of the insulating layer 176. Alternatively, the ground rail 166 can be a +/− power supply rail.

The electrical devices of the present invention: (1) protect against high EOS transient energies; and (2) may eliminate the need for on-die voltage suppressor components for certain applications and permit the use of smaller on-die voltage suppressor components for other applications. In addition, utilizing a voltage variable material on an integrated circuit die in the manner disclosed herein consumes less die area than traditional semiconductor voltage suppression components while having the capability of protecting against comparable EOS transient energies.

It should be understood that various changes and modifications to the presently preferred embodiments described herein will be apparent to those skilled in the art. Such changes and modifications can be made without departing from the spirit and scope of the present invention and without diminishing its attended advantages. It is therefore intended that such changes and modifications be covered by the appended claims.

What is claimed is:

1. An integrated circuit comprising:
    an electrically insulating substrate having at least one microelectronic device formed thereon;
    an input/output pad located on the substrate;
    a conductive member located on the substrate;
    an electrical lead;
    a bond wire electrically connected between the input/output pad and the electrical lead; and
    a voltage variable material located between the bond wire and the conductive member, the voltage variable material exhibiting non-conductive behavior at normal circuit operating voltages and electrically connecting the bond wire to the conductive member when a sufficient EOS transient is introduced into the circuit.

2. The integrated circuit of claim 1, wherein the conductive member is a guard rail.

3. The integrated circuit of claim 1, wherein the voltage variable material fills an entire space between the bond wire and the conductive member.

4. The integrated circuit of claim 1, wherein the integrated circuit includes at least two input/output pads.

5. An electrical device comprising:
    an integrated circuit die;
    an electrical connector connected to the die;
    a conductive guard rail; and
    a voltage variable material exhibiting non-conductive behavior at normal circuit operating voltages and forming a conductive path between the electrical connector and the conductive guard rail when a sufficient EOS transient is introduced into the circuit.

6. The electrical device of claim 5, wherein the electrical connector is an input/output pad.

7. The electrical device of claim 5, wherein the electrical connector is a wire.

8. The electrical device of claim 5, wherein the voltage variable material is selectively deposited on the guard rail, and the electrical connector is a wire juxtaposed to the guard rail.

9. The electrical device of claim 5, wherein the electrical connector is a wire and the wire is coated with the voltage variable material.

10. An electrical device comprising:
    a ground pad;
    an integrated circuit die on the ground pad;
    at least one electrical lead;
    a conductive island having first and second electrical connectors, the first electrical connector connected to the integrated circuit die and the second electrical connector connected to the at least one electrical lead; and
    a voltage variable material disposed between the ground pad and the island.

11. The electrical device of claim 10, wherein the voltage variable material completely fills the space between the ground pad and the island.

12. The electrical device of claim 10, wherein the electrical device includes a plurality of circuits.

13. The electrical device of claim 10, wherein the voltage variable material is disposed between the island and the electrical lead.

14. An integrated circuit comprising:
    a printed circuit board having an input/output pad;
    a substrate having an upper surface facing toward the printed circuit board;
    an input/output pad on the upper surface of the substrate electrically connected to the input/output pad of the printed circuit board;
    a ground pad on the upper surface of the substrate; and
    a voltage variable material located between the ground pad and the input/output pad of the upper surface.

15. The integrated circuit of claim 14, wherein the ground pad is located in juxtaposition to the input/output pad.

16. The integrated circuit of claim 14, wherein the voltage variable material fills the entire space between the ground pad and the input/output pad.

17. The integrated circuit of claim 14, wherein the printed circuit board further includes a ground pad adjacent the input/output pad of the printed circuit board, and the voltage variable material electrically connects the input/output pad of the printed circuit board to the ground pad of the printed circuit board in response to an EOS transient energy.

18. An integrated circuit comprising:
   a printed circuit board having an input/output pad;
   a substrate having an upper surface facing toward the printed circuit board;
   an input/output pad on the upper surface of the substrate electrically connected to the input/output pad of the printed circuit board;
   a ground pad on the printed circuit board, the ground pad adjacent the input/output pad of the printed circuit board; and
   a voltage variable material located between the ground pad and the input/output pad of the printed circuit board.

19. The integrated circuit of claim 18, wherein the ground pad is located adjacent to the input/output pad of the printed circuit board.

20. The integrated circuit of claim 18, wherein the voltage variable material fills the entire space between the ground pad and the input/output pad of the printed circuit board.

21. An integrated circuit comprising:
   an integrated circuit die;
   an insulating layer on the integrated circuit die;
   a first electrical connector;
   a second electrical connector connected to the first electrical connector and connected to the integrated circuit die;
   a conductive member located between a portion of the insulating layer and the integrated circuit die; and
   a voltage variable material interposed between the portion of the insulating layer and the integrated circuit die, the voltage variable material electrically connecting the second electrical connector to the conductive member when a sufficient EOS transient is introduced into the circuit.

22. The integrated circuit of claim 21, wherein the conductive member is on the die.

23. The integrated circuit of claim 21, wherein the conductive member is on the insulating layer.

24. The integrated circuit of claim 21, wherein the insulating layer further includes a first side and the conductive member is located on the first side.

25. The integrated circuit of claim 21, wherein the conductive member is ground rail.

26. The integrated circuit of claim 21, wherein the conductive member is a power rail.

* * * * *